United States Patent
Upadhyaya et al.

(10) Patent No.: US 9,136,690 B1
(45) Date of Patent: Sep. 15, 2015

(54) FRONT-END CIRCUIT WITH ELECTRO-STATIC DISCHARGE PROTECTION

(75) Inventors: Parag Upadhyaya, San Jose, CA (US); Mark J. Marlett, Livermore, CA (US)

(73) Assignee: XILINX, INC., San Jose, CA (US)

(*) Notice: Subject to any disclaimer, the term of this patent is extended or adjusted under 35 U.S.C. 154(b) by 840 days.

(21) Appl. No.: 13/221,219

(22) Filed: Aug. 30, 2011

(51) Int. Cl.
*H02H 1/06* (2006.01)

(52) U.S. Cl.
CPC ........................................ *H02H 1/06* (2013.01)

(58) Field of Classification Search
CPC combination set(s) only.
See application file for complete search history.

(56) References Cited

U.S. PATENT DOCUMENTS

| | | | |
|---|---|---|---|
| 6,404,269 B1 * | 6/2002 | Voldman ........................ | 327/534 |
| 7,511,534 B1 * | 3/2009 | Bringivijayaraghavan et al. ................. | 326/87 |
| 7,755,385 B2 * | 7/2010 | Sreeramaneni ................. | 326/30 |
| 8,010,927 B2 * | 8/2011 | Gauthier et al. .............. | 716/120 |
| 2002/0067185 A1 * | 6/2002 | Kunz et al. ...................... | 326/14 |
| 2002/0070751 A1 * | 6/2002 | Kunz et al. ...................... | 326/14 |
| 2002/0109950 A1 * | 8/2002 | Marr ................ | 361/56 |
| 2004/0080339 A1 * | 4/2004 | Kubo ............................... | 326/83 |
| 2004/0251940 A1 * | 12/2004 | Hayashi et al. ................ | 327/170 |
| 2005/0151561 A1 * | 7/2005 | Choi et al. ....................... | 326/27 |
| 2005/0286333 A1 * | 12/2005 | Gupta et al. .................... | 365/226 |
| 2007/0097568 A1 * | 5/2007 | Miske ............................... | 361/56 |
| 2008/0106834 A1 * | 5/2008 | Hung ............................... | 361/56 |
| 2009/0091986 A1 * | 4/2009 | Bringivijayaraghavan et al. ........................ | 365/189.05 |
| 2010/0066450 A1 * | 3/2010 | Palmer et al. .................. | 330/261 |
| 2010/0165524 A1 * | 7/2010 | Lim ................. | 361/56 |
| 2010/0176776 A1 * | 7/2010 | Wachi ........................... | 323/282 |
| 2013/0278301 A1 * | 10/2013 | Huynh .......................... | 327/110 |
| 2014/0159769 A1 * | 6/2014 | Hong et al. ..................... | 326/30 |
| 2014/0211350 A1 * | 7/2014 | Cox et al. ........................ | 361/56 |

* cited by examiner

*Primary Examiner* — Thienvu Tran
*Assistant Examiner* — Angela Brooks
(74) *Attorney, Agent, or Firm* — LeRoy D. Maunu

(57) ABSTRACT

A termination circuit configured to provide electrostatic discharge (ESD) protection is provided. Termination sub-circuits are coupled in parallel, each including respective pull-up and pull-down circuits. Each pull-up circuit has two transistors of a first type coupled in series between a data input and Vdd, a gate of one of the two transistors being coupled to a control input and a gate of the other one of the two transistors being coupled to a first enable input of the termination sub-circuit. Each pull-down circuit has two transistors of a second type coupled in series between the data input and Vss or ground, a gate of one of the two transistors being coupled to the control input and the gate of the other one of the two transistors being coupled to a second enable input of the termination sub-circuit.

18 Claims, 6 Drawing Sheets

FRONT-END CIRCUIT WITH ELECTRO-STATIC DISCHARGE PROTECTION

FIELD OF THE INVENTION

One or more embodiments generally relate to signal transmission and reception, and more particularly to line termination and electro-static discharge protection.

BACKGROUND

Programmable integrated circuits (ICs) are widely used to design and implement electronic systems. A programmable IC may include a number of configurable resources such as configurable logic blocks, configurable input/output blocks, a configurable interconnect structure, memories, multipliers, processors, etc. The configurable resources of a programmable IC may be programmed to implement a wide variety of desired functions. Typically, configuration data stored in configuration memory cells may be used to define a desired function of the programmable IC. Programmable ICs provide greater design flexibility and allow for reconfiguration, which provides the ability to update implemented functions and reduce inventory by allowing a single part to be used in multiple applications.

Digital systems interface with one another using a wide variety of interface standards. Standardization ensures that different implementations of such interfaces interoperate correctly and provide acceptable performance under expected conditions. This allows an end-user to interface one such digital system (e.g., a computer, a digital camcorder or camera, a cellular telephone, a scanner, a television set, etc.) with another digital system with confidence that the digital systems will be able to successfully communicate with one another.

It is desirable for programmable ICs to be configurable to use a number of different interface standards to allow for use in a wide variety of applications. In addition to protocol definition(s), each standard interface has requirements regarding output impedance, termination impedance, data rate, common mode voltages and other such characteristics. For example, differences of impedance between a transmission line and a receiver front-end circuit can adversely cause a portion of a transmitted signal to be reflected and/or voltage to increase in the receiver. To minimize reflections, termination circuits are generally included in a transmitter and/or receiver analog front-end circuits to match impedance of the circuits and transmission medium and minimize signal reflections.

In addition to termination circuitry, analog front-end circuits typically include circuits to protect the system from electro-static discharge ("ESD"). ESD transfers a sudden and momentary electric current to a circuit from an external source. The inrush of current can destroy components, such as field-effect transistors ("FETs"), and damage or destroy the functionality of the I/O circuit. Because an analog front-end circuit has I/O pads that are externally accessible, via a transmission line connected thereto, the front-end circuit is susceptible to damage from ESD. An ESD can be a negative voltage or a positive voltage relative to circuit ground. Conventionally, ESD protection circuits are relatively big in order to handle the discharge current without being damaged. For ICs having a high number of I/O pads, such as field-programmable gate arrays ("FPGAs"), providing ESD protection to all components for I/Os susceptible to ESD damage consumes considerable silicon area.

One or embodiments may address one or more of the above issues.

SUMMARY

In one embodiment, a termination circuit configured to provide electrostatic discharge (ESD) protection is provided. The termination circuit includes a plurality of termination sub-circuits which are coupled in parallel. Each termination sub-circuit includes a pull-up circuit and a pull-down circuit. The pull-up circuit has two transistors of a first type coupled in series between a data input of the termination circuit and a first supply voltage (Vdd). One of the two transistors of the first type has a gate coupled to a control input of the termination circuit and the other one of the two transistors of the first type has a gate coupled to a first enable input of the termination sub-circuit. The pull-down circuit has two transistors of a second type coupled in series between the data input and a second supply voltage (Vss or ground). One of the two transistors of the second type has a gate coupled to the control input and the other one of the two transistors of the second type has a gate coupled to a second enable input of the termination sub-circuit.

In another embodiment, a circuit is provided. The circuit includes a first programmable termination circuit having a terminal coupled to a first differential input of the circuit, and a second programmable termination circuit having a terminal coupled to a second differential input of the circuit. A difference amplifier has first and second inputs coupled to the first and second differential inputs of the circuit. A sub-circuit is coupled to the first and second programmable termination circuits and the difference amplifier. The sub-circuit is configured to adjust a common mode offset of signals received from the first and second programmable termination circuits to match an offset of the difference amplifier.

A method for receiving an electronic signal on a transmission medium is provided in another embodiment. The method includes matching a termination impedance of first and second termination circuits to impedance of a transmission medium, where the first and second termination circuits are respectively coupled to first and second differential inputs. The matching includes, for each of the first and second differential inputs, enabling a number of termination sub-circuits of a plurality of termination sub-circuits included in a respective programmable termination circuit coupled to the differential input. Electrostatic discharge (ESD) protection is provided by coupling a body diode of one or more transistors of each termination sub-circuit to implement a voltage clamp. Each body diode has an anode at the source and a cathode at the drain of the corresponding transistor. A common mode offset of a received signal is adjusted to match a common mode of a difference amplifier having first and second inputs respectively coupled to the first and second differential inputs. A signal line is driven with an output signal generated by the difference amplifier.

Other embodiments will be recognized from consideration of the Detailed Description and Claims, which follow.

BRIEF DESCRIPTION OF THE DRAWINGS

Various aspects and advantages will become apparent upon review of the following detailed description and upon reference to the drawings in which.

DETAILED DESCRIPTION OF THE DRAWINGS

A typical solution for transmitter and receiver front-end circuits generally uses differential circuitry, such as current mode logic (CML), for linear equalization. The input common mode for the differential front-end circuit is typically set using resistor divider topology and termination impedance of the front-end circuit is matched to the impedance of the transmission medium using poly resistors. ESD protection is independently provided by a separate diode solution. Typically, this arrangement results in high input and output parasitic capacitance, which may reduce the bandwidth of the circuit and make high speed linear equalization challenging without using reactive components such as inductors.

One or more embodiments provide a programmable termination circuit that may be adjusted to match various line impedances. In one embodiment, the programmable termination circuit includes a plurality of active field effect transistor (FET) based termination circuits, which may be selectively enabled and disabled to adjust the impedance of the circuit. In addition to the termination functionality, the FETs of the termination circuits are arranged to provide ESD protection using P/N junction diodes between source and drain regions of the FETs. This reduces input parasitic capacitance of the circuit as well as the area needed for circuit implementation.

Figure 1:
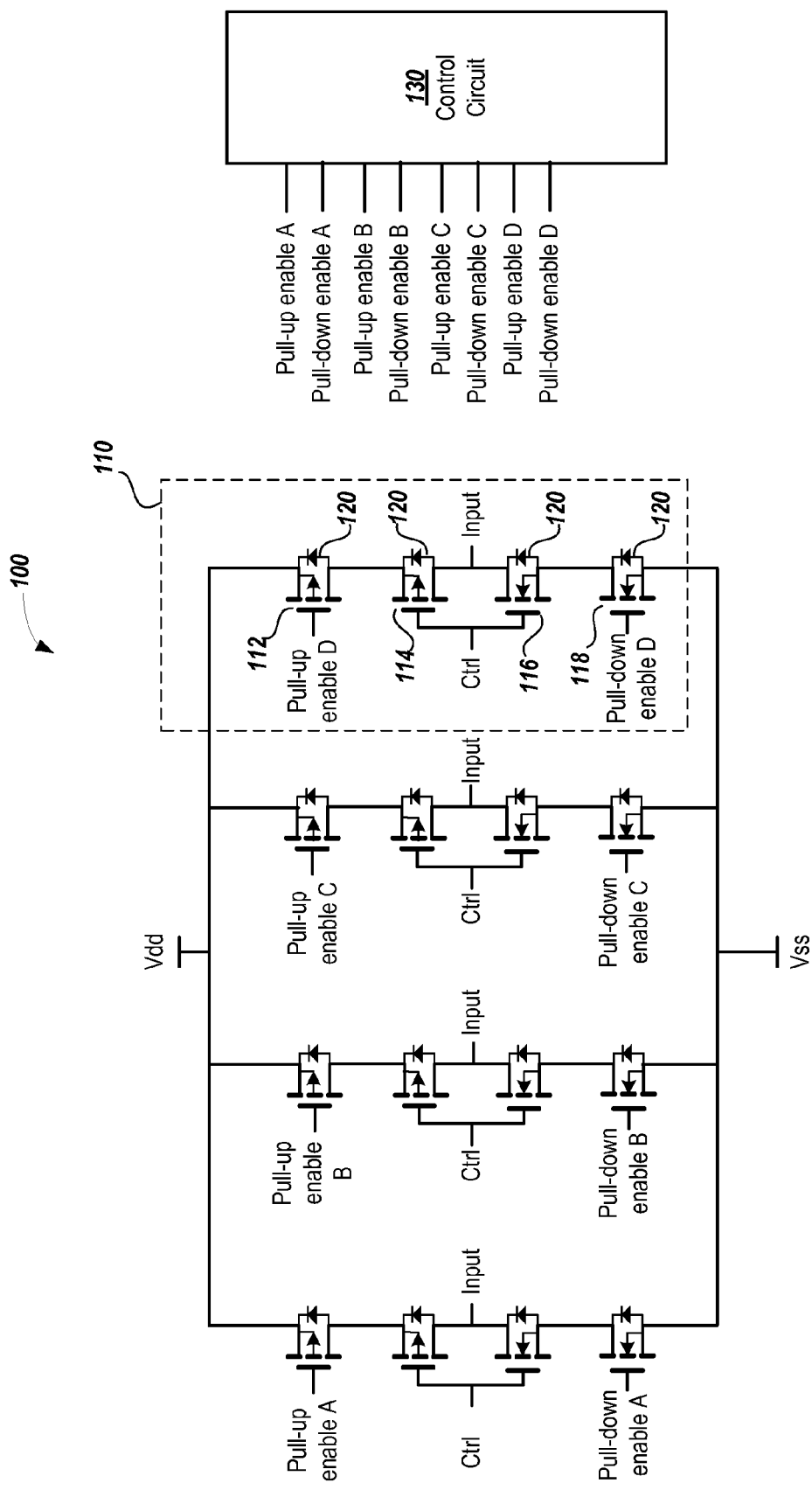
FIG. 1 shows a circuit diagram of a programmable termination and ESD protection circuit.

FIG. 1 shows a circuit diagram of a programmable termination circuit configured to provide ESD protection. The programmable termination circuit 100 includes a plurality of termination sub-circuits coupled in parallel. Dashed block 110 shows one of the termination sub-circuits. Each termination sub-circuit 110 includes a pull-up circuit having two PMOS transistors 112 and 114 coupled in series between a data input of the termination circuit (Input) and a high supply voltage (Vdd). Each termination sub-circuit 110 also includes a pull-down circuit having two NMOS transistors 116 and 118 coupled in series between the data input and a low supply voltage (Vss).

In each of the pull-up and pull-down circuits, one of the transistors (114 and 116) is driven by a control signal to provide active termination. The other transistor (112 and 118) in each of the pull-up and pull-down circuits is driven by a respective enable signal, which can selectively enable/disable the pull-up or pull-down circuit.

As an illustrative example of the termination function, consider a termination circuit in which impedance is matched by enabling transistors 112 and 118 of only one termination sub-circuit. Because only one termination sub-circuit is operated, the in-series on-resistance of each of the pull-up and pull-down circuits are selected to be equal to the impedance of the transmission line. For example, if the transmission line connected to Input has an impedance of 100Ω, transistors 114 and 112 of the pull-up circuit would be selected to have a combined in-series on-resistance of 100Ω. Likewise, transistors 116 and 118 and would be selected to have a combined in-series on-resistance of 100Ω.

The Ctrl signal activates the pull-up and pull-down circuits to provide active termination in response to signal transitions detected on the Input. In a simple illustrative implementation, the complement of the Input signal may be used for Ctrl. When the Input signal is a logical "1", PMOS 114 of the pull-up circuit is activated to provide a termination impedance matching the transmission line. Conversely, when the Input signal is a logical "0", NMOS 116 of the pull-down circuit is activated to provide a termination impedance matching the transmission line.

The programmable termination circuit may adjust the impedance of the circuit (as seen by the transmission line) by enabling multiple ones of the sub-circuits 110 to operate in parallel. Continuing the above example, where each pull-up and pull-down circuit has an in-series on-resistance of 100Ω, a 50Ω impedance may be exhibited by enabling two of the parallel-coupled sub-circuits 110. When the Ctrl signal activates transistors 114 of the pull-up circuits, a 50Ω impedance is exhibited due to the two parallel 100Ω resistive paths between the Input and Vdd. In this manner, different numbers of pull-up and pull-down circuits may be enabled, via respective transistors 112 and 118 in the sub-circuits, to adjust the exhibited impedance. In this example, the programmable termination circuit 100 includes four termination sub-circuits. It is recognized that the programmable termination circuit 100 may include any number of termination sub-circuits depending on the application. Likewise, one or more embodiments may employ multiple instances of the programmable termination circuit 100 that are coupled in parallel and controlled by a single control circuit that selectably couples one or more of the instances to a transmission line.

In one or more embodiments, each pull-up and pull-down circuit is configured to have the same in-series on-resistance. The impedance exhibited by the programmable termination is given by, $$Z = R/N,$$

where R is the in-series on-resistance of each pull-up and pull-down circuit and N is the number of enabled sub-circuits enabled by respective pull-up enable and pull-down enable signals. In some other embodiments, different termination sub-circuits may be configured to exhibit different impedances and allow for a wider selection of impedance values to be matched by the programmable termination circuit 100.

In one or more embodiments a control circuit 130 is configured and arranged to generate respective pull-up and pull-down enable signals, which drive transistors 112 and 118 of each sub-circuit. The control circuit may be implemented as one or more processors configured to execute software, as an application specific integrated circuit (ASIC), or as a logic on a programmable logic device.

Control circuit 130 may be configured in a number of ways, depending on the in-series on-resistance of the different termination sub-circuits, to cause the programmable termination circuit 100 to exhibit different impedances. In one or more embodiments, the control circuit is configured to generate enabled signals using an analog-to-digital converter configured for thermometer coding. In thermometer coding schemes, a string of bits includes a number of adjacent ones. The number of ones in the string represents the value of the code. For example, in a four-bit thermometer code possible values include '0001', '0011', '0111', and '1111'. Each bit represents a respective enable of a different sub-circuit.

Using the thermocoding control arrangement, the four termination sub-circuits shown in FIG. 1 can be configured to have different in-series on-resistances that provide evenly spaced impedance options. For example, pull-up and pull-down circuits of the four termination sub-circuits may be configured to have respective in-series on-resistance values 100Ω, 300Ω, 150Ω, and 50Ω, respectively. When the parallel termination sub-circuits are incrementally enabled by the thermocoding control arrangement, the programmable termination circuit 100 incrementally decreases impedance from 100Ω in 25Ω increments as shown by the computations in Example 1.

EXAMPLE 1
$$\frac{1}{100} = \frac{1}{100}$$
$$\frac{1}{75} = \frac{1}{100} + \frac{1}{300}$$
$$\frac{1}{50} = \frac{1}{100} + \frac{1}{300} + \frac{1}{150}$$
$$\frac{1}{25} = \frac{1}{100} + \frac{1}{300} + \frac{1}{150} + \frac{1}{50}$$

In one or more embodiments, the programmable termination impedance is derived from the MOSFET, in that no poly resistors are used. In some other embodiments, resistors may be coupled in series with one or more pull-up and pull-down circuits to augment impedance of the circuit.

In addition to providing configurable impedance, the programmable termination circuit 100 is also configured to provide ESD protection. In each termination sub-circuit, the transistors are arranged to form series-coupled source/drain junction diodes. The transistors 112 and 114 of the pull-up circuit have body diodes 120 biased to implement a first voltage clamp that limits the voltage level of the data Input to a level of Vdd+2*Vd, wherein Vd is the voltage drop of each body diode. In response to an ESD voltage exceeding Vdd+2*Vd, the voltage passes from the Input to the Vdd source. Similarly, the transistors 116 and 118 of the pull-down circuit have body diodes 120 biased to implement a second voltage clamp that limits the Input voltage to a level of Vss−2*Vd. In response to an ESD voltage below Vdd−2*Vd, the voltage passes from the Vss source to the Input. The body diodes provide body contacts to the Vdd and Vss voltages for the respective transistors.

Figure 2:
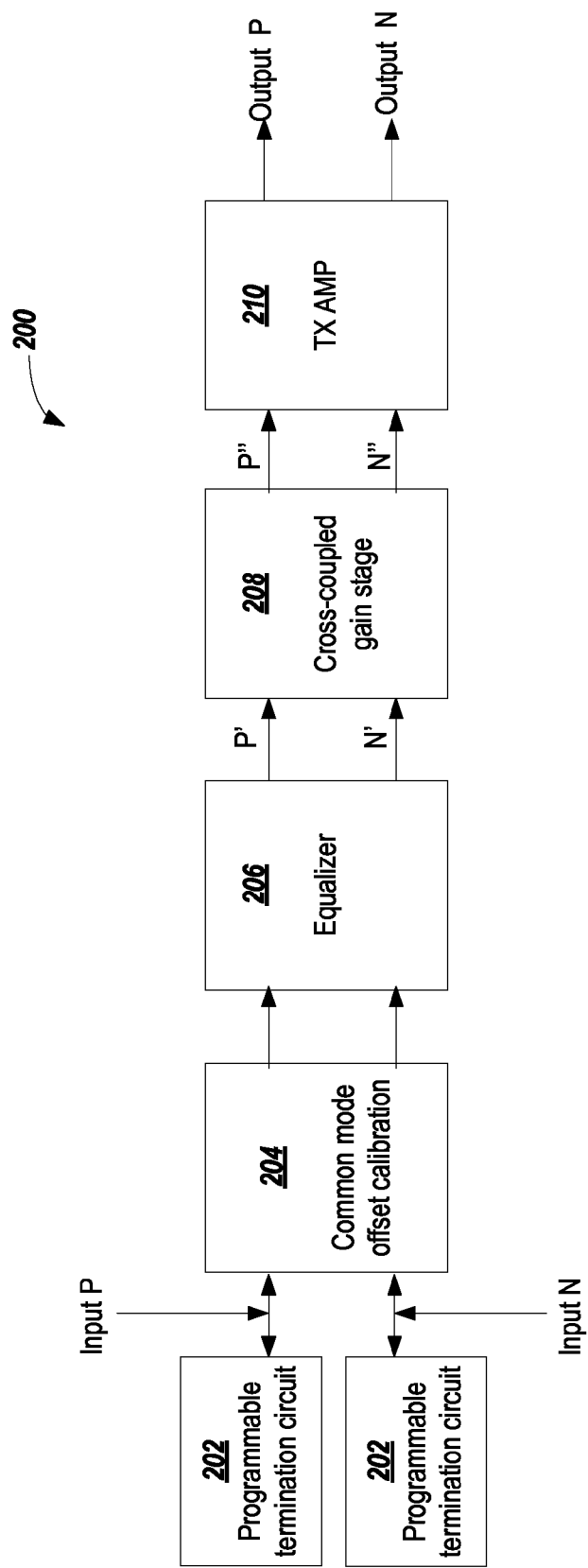
FIG. 2 shows a block diagram of an analog front-end circuit.

FIG. 2 shows a block diagram of an analog front-end (AFE) circuit. The AFE circuit 200 includes a respective programmable termination circuit 202, as described in relation to FIG. 1, coupled to each one of differential inputs (Input P and Input N). As described with reference to FIG. 1, depending on the implementation, each of the respective termination circuits 202 may include any number of programmable termination circuits coupled together in parallel, which may be controlled by the same set or different sets of enable signals. In addition to programmable termination circuits 202, the AFE circuit includes common mode offset calibration circuit 204, equalization circuit 206, and cross coupled gain stage circuit 208, which are described with relation to FIGS. 3-5.

TX amplifier 210 follows the cross-coupled gain circuit 208 and is used to drive the output of the AFE circuit. Due to differing communication standards, the common mode offset voltage utilized by various transmitters can vary widely and may not be compatible with TX amplifier 210. To be compatible with different common mode standards, the AFE circuit may include a common mode selection/offset calibration circuit 204 that is configured to adjust the common mode offset of a received signal to match the common mode, which is used by the amplification stages circuit 210 of the AFE circuit 200.

Figure 3:
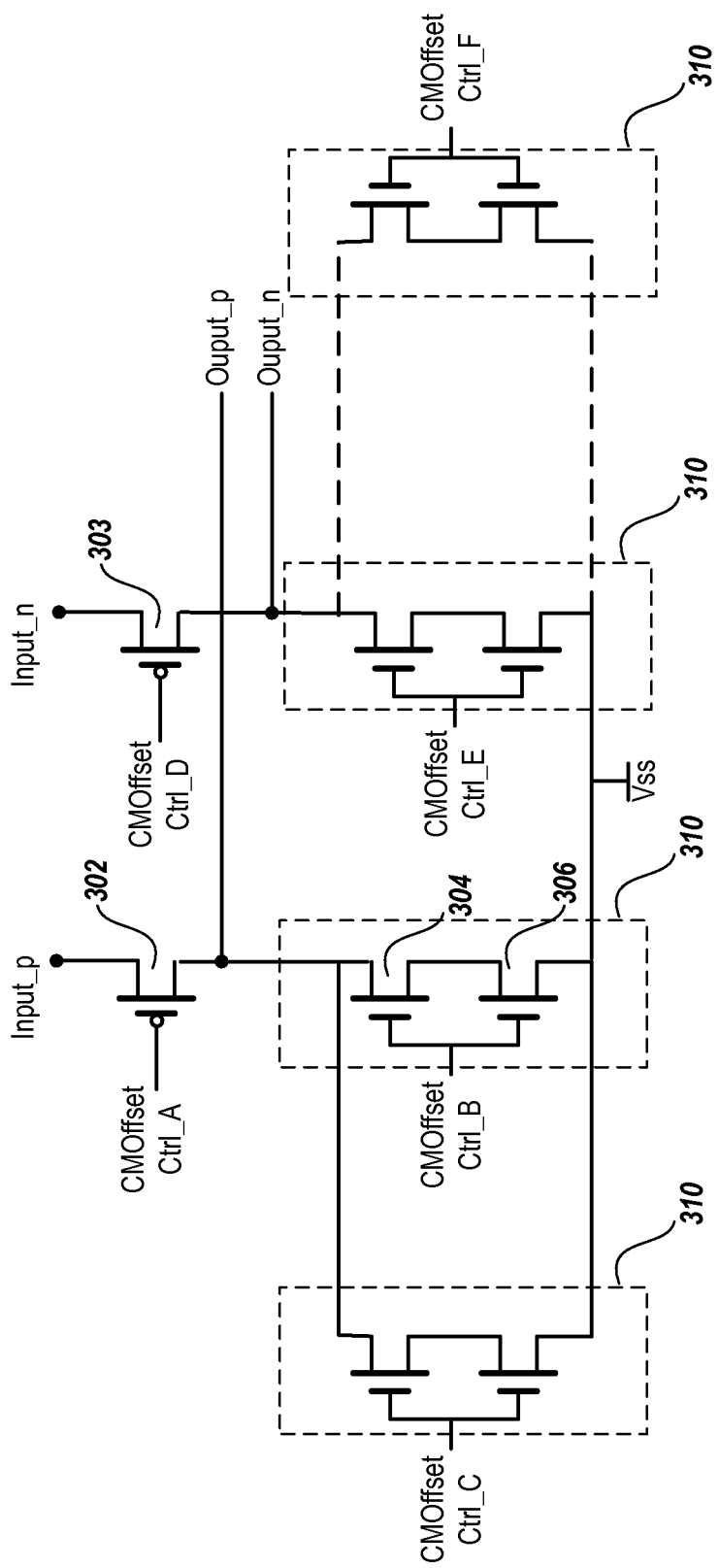
FIG. 3 shows a circuit diagram of the common mode offset calibration circuit shown in FIG. 2.

FIG. 3 shows a circuit diagram of an example implementation of the common mode offset calibration circuit 204. For each one of differential inputs, Input_p and Input_n, the circuit includes a respective PMOS transistor 302 and 303 coupled between the input and a respective output Output_p and Output_n. For each output, the offset calibration circuit includes one or more pull down legs 310 that may be controlled to adjust the offset. Each pull down leg 310 includes two pull-down NMOS transistors 304 and 306 that are coupled in series between the differential output and the Vss voltage. The gates of the PMOS transistors 302 and 303 are biased to ground since it is a common gate input stage. Offset calibration and common mode adjustment of Input_p may be controlled by adjusting the ratio of offset control signal CMOffset Ctrl_A and the offset control signals, for example, CMOffset Ctrl_B and CMOffset Ctrl_C, of the pull down legs for Output_p. Likewise, offset calibration and common mode adjustment of Input_n may be controlled by adjusting the ratio of offset control signal CMOffset Ctrl_D and the offset control signals, for example, CMOffset Ctrl_E, CMOffset Ctrl_F, of the pull down legs for Output_n. The NMOS transistors 304 and 306 of each pull down leg may be independently controlled by respective enable signals to adjust offset for each differential input of Input_P and Input_N. For example, in one embodiment a respective thermometer coded digital to analog converter (not shown) may be used to generate a respective set of enable signals for each differential input to allow independent control of offset calibration and common mode adjustment of each differential input. To compensate for channel and backplane losses, one or more high pass and/or low pass gain/attenuation stages 206 may be implemented, as shown in FIG. 2.

Figure 4:
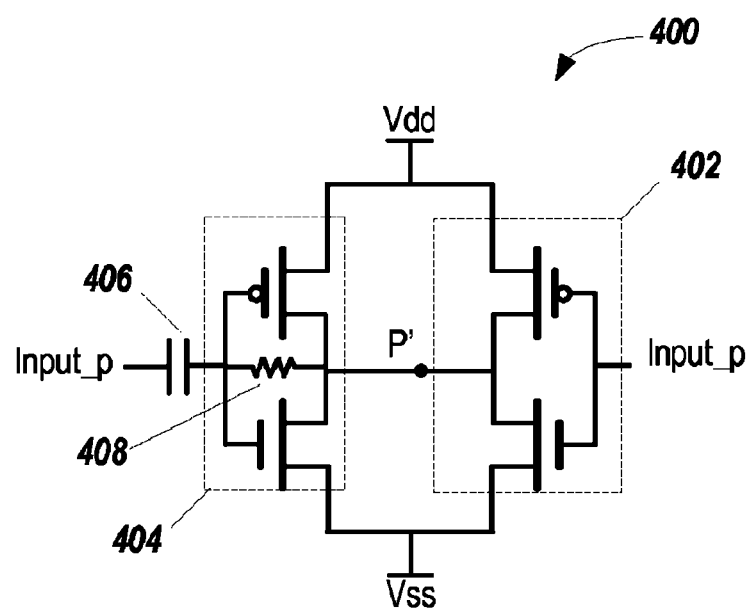
FIG. 4 shows a circuit diagram of the equalizer circuit shown in FIG. 2.

FIG. 4 shows a circuit diagram of an example equalizer circuit 400 that may be used to implement an equalizer circuit 206 shown in FIG. 2. For ease of illustration, the equalizer circuit is depicted for one differential input Input_p. It is recognized that a second matching equalization circuit would be implemented for the other differential input as well. The equalizer circuit contains two inverter circuits, 402 and 404, coupled in parallel between the input Input_p and the output P' of the equalization circuit 400. Inverter 404 has a resistive feedback 408 coupled between an input and an output of the inverter circuit to provide a high frequency gain. A capacitor 406 is coupled between the input Input_p and inverter 404 to reduce shunt parasitic bias. The second inverter 402 provides a DC path for the equalizer. In this example implementation, the equalizer circuit 400 is illustrated as a single stage equalizer. It is understood that in one or more embodiments, the equalizer circuit may include multiple equalizer stages in addition to that shown in FIG. 4. In this implementation, each equalizer stage will invert the phase. If an odd number of equalizer states are included in the equalizer circuit, the next stage in the equalizer circuit should be configured to correct for the output phase inversion.

Figure 5:
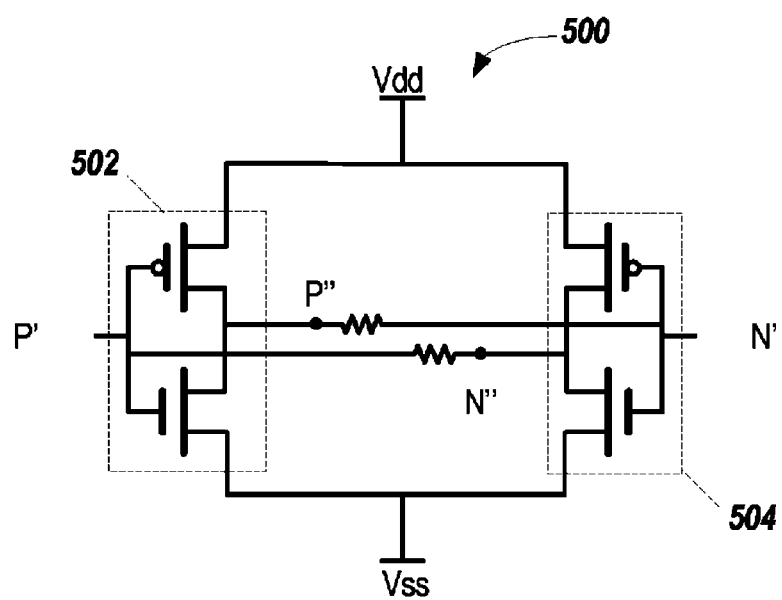
FIG. 5 shows a circuit diagram of the cross-coupled gain stage shown in FIG. 2.

FIG. 5 shows a circuit diagram of an example circuit 500 that may be used to implement the cross-coupled gain stage 208 shown in FIG. 2. The cross-coupled gain circuit 500 includes first and second CMOS driver circuits 502 and 504 having respective inputs coupled to differential inputs P' and N' from the respective equalizer circuits (see FIG. 4), and respective outputs coupled to P" and N". The CMOS driver circuits are arranged in a cross-coupled configuration, where the output of CMOS driver 502 is coupled to the input of CMOS driver 504 via a resistive path, and vice-versa. The cross-coupled configuration helps to reduce DC offset as well as maintain pseudo-differential operation. Differential outputs P" and N" are input to TX amplifier 210 shown in FIG. 2.

Figure 6:
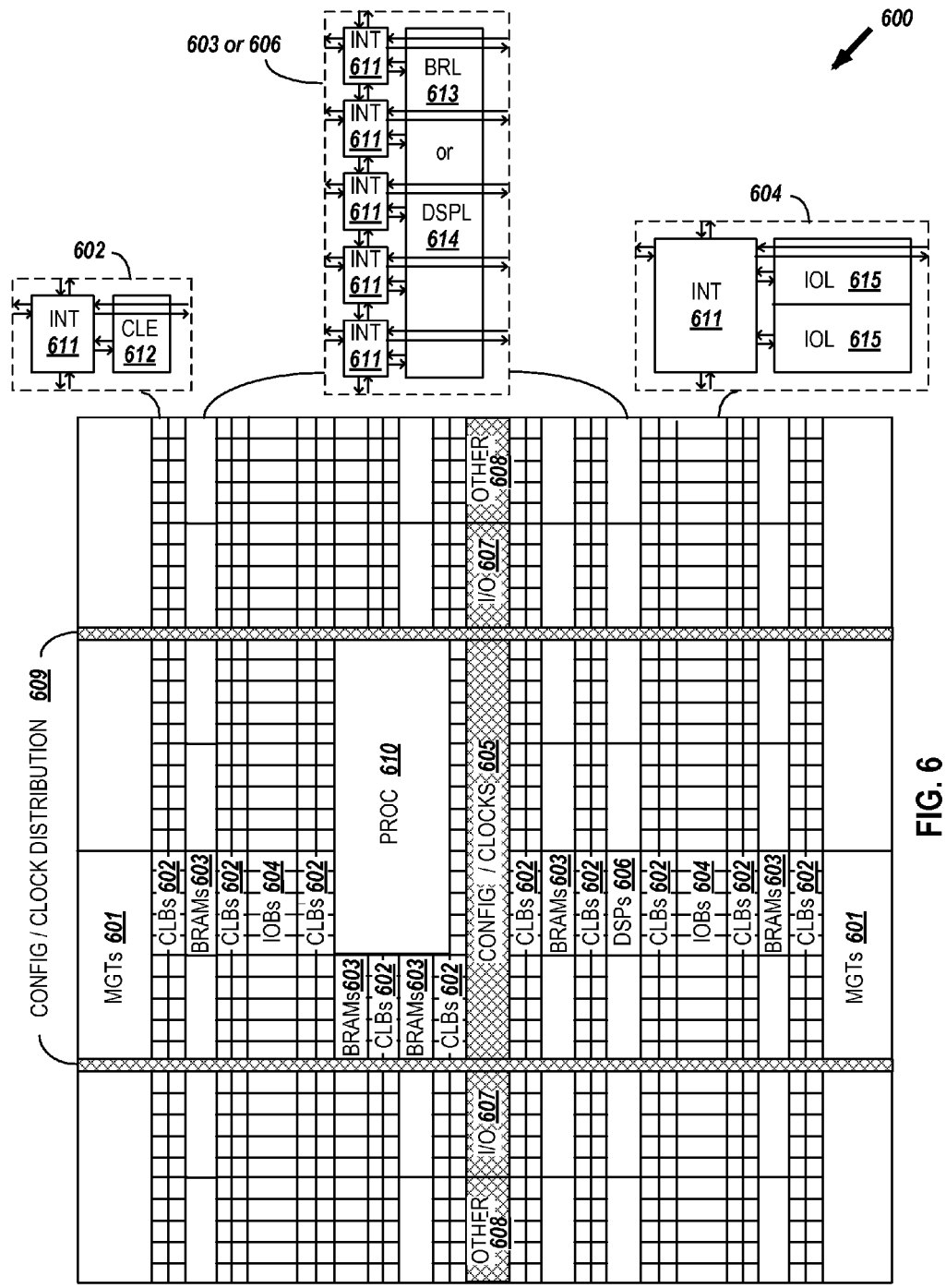
FIG. 6 shows a block diagram of an example programmable integrated circuit that may be implementing using an analog front-end circuit having the termination and ESD protection circuitry in accordance with one or more embodiments.

FIG. 6 is a block diagram of an example programmable integrated circuit that may be implementing with an analog front-end circuit having the termination and ESD protection circuitry described above. A programmable IC, as previously described, may be implemented on the programmable logic and interconnect resources of programmable integrated circuit. One type of programmable IC is a field programmable gate array (FPGA).

FPGAs can include several different types of programmable logic blocks in the array. For example, FIG. 6 illustrates an FPGA architecture (600) that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607), for example, e.g., clock ports, and other programmable logic 608 such as digital clock managers, analog-to-digital converters, system monitoring logic, and so forth. Some FPGAs also include dedicated processor blocks (PROC 610) and internal and external reconfiguration ports (not shown).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element INT 611. A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

The embodiments are thought to be applicable to a variety of systems utilizing termination and ESD protection circuitry. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope and spirit of the invention being indicated by the following claims.

What is claimed is:

1. A circuit configured to provide electrostatic discharge (ESD) protection, comprising:
    a data input and a control input;
    a plurality of termination sub-circuits coupled in parallel, each termination sub-circuit including:
        a pull-up circuit having two transistors of a first type coupled in series between the data input and a first supply voltage (V1), one of the two transistors of the first type having a gate coupled to the control input and the other one of the two transistors of the first type having a gate coupled to a first enable input of the termination sub-circuit, the two transistors of the first type having body diodes biased to implement a first voltage clamp that limits voltage level of the data input to a level of V1+2*Vd, wherein Vd is the voltage drop of each body diode; and
        a pull-down circuit having two transistors of a second type coupled in series between the data input and a second supply voltage (V2), one of the two transistors of the second type having a gate coupled to the control input and the other one of the two transistors of the second type having a gate coupled to a second enable input of the termination sub-circuit, the two transistors of the second type having body diodes biased to implement a second voltage clamp that limits the input voltage to a level of V2−2*Vd.

2. The circuit of claim 1, wherein the two transistors of the first type each have a body contact coupled to the V1 voltage.

3. The circuit of claim 1, wherein the two transistors of the second type each have a body contact coupled to the V2 voltage.

4. The circuit of claim 1, further comprising:
    a control circuit coupled to the first and second enable inputs of each of the plurality of termination sub-circuits, the control circuit configured to adjust a number of the plurality of pull-up and pull-down circuits that are enabled in response to an impedance control signal for adjusting impedance at the data input.

5. The circuit of claim 4, wherein the control circuit includes an analog-to-digital converter (ADC) configured for thermometer coding, the ADC having a plurality of digital outputs coupled to respective ones of the first and second enable inputs of the plurality of termination sub-circuits.

6. The circuit of claim 1, wherein the second enable input of each termination sub-circuit is a complement of the first enable input of said termination sub-circuit.

7. The circuit of claim 1, wherein the control circuit is configured to match the impedance of a differential amplifier coupled to the plurality of termination sub-circuits by enabling one or more of the pull-up and pull-down circuits of the plurality of termination sub-circuits.

8. The circuit of claim 1, further comprising:
a first termination circuit including the plurality of termination sub-circuits;
a second termination circuit including another plurality of termination sub-circuits;
a first differential input coupled to the data input of the first termination circuit;
a second differential input coupled to the data input of the second termination circuit;
a difference amplifier having first and second inputs coupled to the first and second differential inputs of the circuit; and
a sub-circuit coupled to the first and second termination circuits and the difference amplifier, the sub-circuit configured to adjust a common mode offset of signals received from the first and second termination circuits to match an offset of the difference amplifier.

9. The circuit of claim 8, further comprising an equalization boost circuit coupled to the difference amplifier.

10. The circuit of claim 9, wherein for each of the differential inputs the equalization boost circuit includes:
a first latch; and
an active high pass filter coupled in parallel with the first latch, the active high pass filter including:
a second latch coupled in parallel with the first latch;
a resistive element coupled between an input and an output of the second latch; and
a bypass capacitor coupled between the differential input and an input of the second latch.

11. The circuit of claim 9, further comprising a cross-coupled gain stage coupled to the equalization boost circuit.

12. The circuit of claim 11, wherein the cross-coupled gain stage includes:
a first latch having an input coupled to a first differential input of the cross-coupled gain stage;
a second latch having an input coupled to a second differential input of the cross-coupled gain stage;
a first resistive element coupled between an output of the first latch and the input of the second latch; and
a second resistive element coupled between an output of the second latch and the input of the first latch.

13. The circuit of claim 1, further comprising:
a control circuit coupled to the first and second enable inputs and configured to, in response to an impedance control signal for adjusting impedance at the data input, adjust a number of pull-up and pull-down circuits in the plurality of termination sub-circuits that are enabled.

14. The circuit of claim 13, wherein the control circuit includes an analog-to-digital converter (ADC) configured for thermometer coding, the ADC having a plurality of digital outputs coupled to respective ones of the first and second enable inputs of the plurality of termination sub-circuits.

15. A termination circuit, comprising:
a data input;
a plurality of termination sub-circuits coupled in parallel, each termination sub-circuit including
a pull-up circuit configured to adjust an impedance of a first path between the data input and a first supply voltage (V1) according to a voltage of a control input of the termination circuit and in response to a first enable input of the termination sub-circuit; and
a pull-down circuit configured to adjust an impedance of a second path between the data input and a second supply voltage (V2) according to a voltage of the control input and in response to a second enable input of the termination sub-circuit; and
wherein the first path passes through a first transistor in the pull-up circuit, the first transistor having a body diode arranged to provide electrostatic discharge (ESD) protection, and second path passes through a second transistor, in the pull-down circuit, the second transistor having a body diode arranged to provide ESD protection for the data input.

16. The circuit of claim 15, wherein the pull-up circuit includes two transistors of a first type coupled in series between the data input of the termination circuit and V1, one of the two transistors of the first type having a gate coupled to the control input and the other one of the two transistors of the first type having a gate coupled to the first enable input; and
the pull-down circuit includes two transistors of a second type coupled in series between the data input of the termination circuit and V2, one of the two transistors of the second type having a gate coupled to the control input and the other one of the two transistors of the second type having a gate coupled to the first enable input.

17. The circuit of claim 16, wherein
the first voltage clamp limits voltage level of the data input to a level of equal to the sum of V1 and a first voltage drop across the body diodes of the pull-up circuit; and
the second voltage clamp limits voltage level of the data input to a level of equal to the V2 less a second voltage drop across the body diodes of the pull-down circuit.

18. The circuit of claim 15, wherein:
the transistors of the pull-up circuit have body diodes arranged to implement a first voltage clamp; and
the transistors of the pull-down circuit have body diodes arranged to implement a second voltage clamp.

\* \* \* \* \*